(12) United States Patent
Hoshika et al.

(10) Patent No.: US 9,383,232 B2
(45) Date of Patent: Jul. 5, 2016

(54) PHYSICAL QUANTITY DETECTION DEVICE

(71) Applicant: Hitachi Automotive Systems, Ltd., Hitachinaka-shi, Ibaraki (JP)

(72) Inventors: Hiroaki Hoshika, Hitachinaka (JP); Takeo Hosokawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 208 days.

(21) Appl. No.: 14/354,154

(22) PCT Filed: Dec. 7, 2012

(86) PCT No.: PCT/JP2012/081734
§ 371 (c)(1),
(2) Date: Apr. 25, 2014

(87) PCT Pub. No.: WO2013/108505
PCT Pub. Date: Jul. 25, 2013

(65) Prior Publication Data
US 2014/0298930 A1    Oct. 9, 2014

(30) Foreign Application Priority Data
Jan. 16, 2012 (JP) .................................. 2012-006536

(51) Int. Cl.
*G01D 11/00* (2006.01)
*H03K 19/0175* (2006.01)

(52) U.S. Cl.
CPC ............ *G01D 11/00* (2013.01); *H03K 19/0175* (2013.01); *H03K 19/017509* (2013.01)

(58) Field of Classification Search
CPC .................. H03K 19/018521; H03K 19/0175; H03K 19/017509; H03K 3/356104; G05F 3/02; G01D 11/00
See application file for complete search history.

(56) References Cited

U.S. PATENT DOCUMENTS

2014/0043084 A1    2/2014    Iwata

FOREIGN PATENT DOCUMENTS

| JP | 2002-185293 A | 6/2002 |
| JP | 2003-133937 A | 5/2003 |
| JP | 2008-016941 A | 1/2008 |
| JP | 2010-068321 A | 3/2010 |
| WO | WO 2012/157031 A1 | 11/2012 |

OTHER PUBLICATIONS

International Search Report with English translation dated Mar. 19, 2013 (4 pages).

*Primary Examiner* — Daniel S Larkin
*Assistant Examiner* — Jamar Ray
(74) *Attorney, Agent, or Firm* — Crowell & Moring LLP

(57) ABSTRACT

In order to make a physical quantity detection device whose sensor and logical circuit operate with different operating voltages have a simple configuration and be capable of recognizing a detection result of the sensor accurately, the physical quantity detection device according to the present invention is configured so that the sensor and the logical circuit may be connected by a bidirectional communication line and may be operate with mutually different operating voltages, and when receiving the detection result of the sensor, recognizes Hi/Lo level signals using second Hi/Lo level thresholds set up on arithmetic processing in place of first Hi/Lo level thresholds that an arithmetic unit has.

14 Claims, 11 Drawing Sheets

FIG. 9
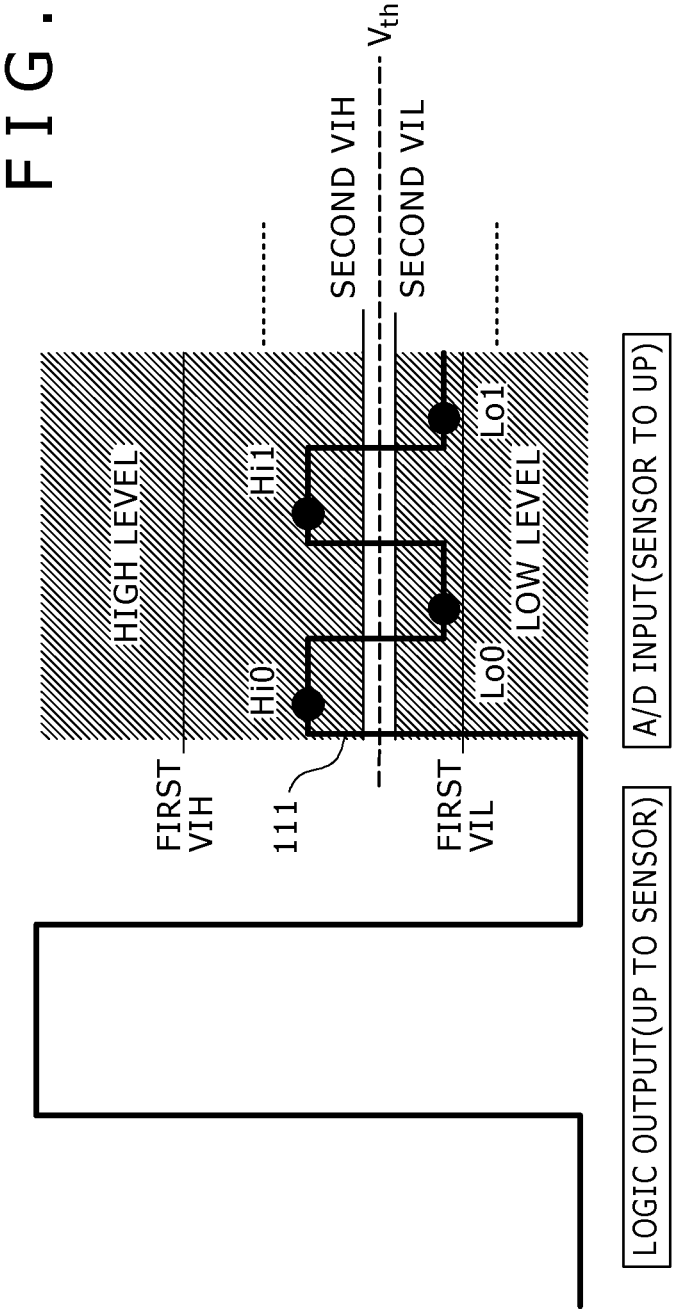
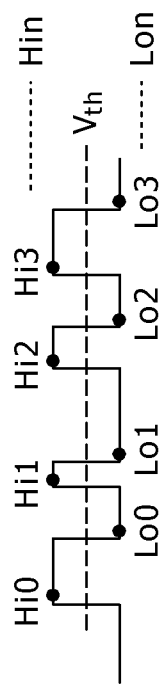

PHYSICAL QUANTITY DETECTION DEVICE

TECHNICAL FIELD

The present invention relates to a physical quantity detection device that communicates with a sensor for detecting a physical quantity and acquires a detection result.

BACKGROUND ART

There are used sensors that detect various kinds of physical quantities such as a temperature, a pressure, and a flow rate for control and safety ensuring of vehicles, consumer products, industrial equipment, etc. Such a sensor has a physical quantity detection part for taking out a physical quantity as an electric signal, an amplifier part for amplifying the electric signal to a desired magnitude, an output signal modulation part for outputting the detected physical quantity to the outside, etc. A series of signal manipulations and signal processing are performed by a logical circuit such as a microprocessor. Since microprocessors used for an automotive application support a power source voltage variation and a variation of the earth potential, many operate with a voltage of about 5V.

A sensing element for detecting a physical quantity and its peripheral circuits have advanced to a stage where, due to advances in a semiconductor technology, the detected physical quantity is converted into a numeral value through digital processing by a circuit on a single semiconductor substrate and these pieces of information are sent to a higher order circuit by reduced-wiring serial communication, for example, I2C (Inter-Integrated Circuit), etc. This is because the reduced-wiring serial communication such as the I2C can reduce the number of wiring because transmission and reception in communication are used alternately on a single strand of wiring, and eventually can miniaturize the sensor itself.

In the case where a weak signal that the sensor uses to transmit the detection result is received and a physical quantity is detected by interpreting the weak signal, there is a case where an error may be produced in the detected physical quantity by heat generation of a digital processing circuit. Therefore, a technique of reducing a consumption current by lowering an operating voltage of the circuit and making a heating value small has been widely adopted. As for the power source voltage of the sensor at this time, a voltage of about 2 V to 3 V is used.

In the case where a sensor system is comprised by connecting these serial communication type sensor and microprocessor, since bidirectional serial communication needs to be conducted between the circuits whose power source voltages differ as mentioned above, generally a bidirectional level converter circuit is used.

In FIG. 1 of the below-mentioned Patent Literature 1, a signal of a microcomputer on a 5-V side is subjected to voltage division with voltage dividing resistors r2 and r3, and they are transmitted to a microcomputer of 3.3-V side through a diode d2. A signal from a 3.3-V side microcomputer is transmitted to a 5-V side microcomputer through a diode d1, and the voltage dividing resistors r2 and r3 operate as load resistors. Under this circuit configuration, when the 5-V side microcomputer is a high level, the 3.3-V side microcomputer becomes not less than 2.2 V and less than 3.3 V; when the 5-V side microcomputer is a low level, the 3.3-V side microcomputer also becomes a low level; conversely, when the 3.3-V side microcomputer becomes a high level, the 5-V side microcomputer becomes more than or equal to 3.5 V; and when the 3.3-V side microcomputer becomes the low level, the 5-V side microcomputer becomes 1.5 V. By these operations, the both of the 5-V side microcomputer and the 3.3-V side microcomputer can recognize a high level signal and a low level signal.

CITATION LIST

Patent Literature

Patent Literature 1: Japanese Unexamined Patent Application Publication No. 2003-133937

SUMMARY OF INVENTION

Technical Problem

In a bidirectional level converter circuit using a semiconductor (in the literature, a diode d1) as is described in Patent Literature 1, there is case where a threshold margin on a low level side may be insufficient and a cost increases as compared with a circuit that does not use the semiconductor. In addition, providing a semiconductor part comes with the following problems: the number of parts increases and a part installation area increases; a work burden of properly managing a direction in which the parts are installed; reliability as the whole circuit lowers; and the circuit becomes disadvantageous for a high temperature operation, etc. Furthermore, since a voltage range of the low voltage side that can be supported by the bidirectional level converter circuit is limited, there is a possibility of performing misrecognition of a detection value.

The present invention is made in view of the above-mentioned problems, and has an object of, in a physical quantity detection device whose sensor and logical circuit operate with different operating voltages, enabling the device to recognize a detection result of the sensor accurately with a simple configuration.

Solution to Problem

A physical quantity detection device according to the present invention is configured so that its sensor and logical circuit may be connected with each other by a bidirectional communication line and may operate with mutually different operating voltages, and when receiving the detection result of the sensor, recognizes Hi/Lo level signals using second Hi/Lo level thresholds set up on arithmetic processing in place of first Hi/Lo level thresholds that the arithmetic unit has.

Advantageous Effects of Invention

According to the physical quantity detection device according to the present invention, even when the signal received through the bidirectional communication line does not reach original Hi/Lo level thresholds, Hi/Lo levels of the signal can be recognized accurately.

BRIEF DESCRIPTION OF DRAWINGS

FIG. 9 explains a procedure of calculating a threshold $V_{th}$.

DESCRIPTION OF EMBODIMENTS

Hereinafter, with reference to drawings, an example where a detection result of a sensor is transmitted and received to/from a digital logical circuit such as a microcomputer and a system LSI (hereinafter, generally termed as a microcomputer) by I2C communication will be explained. Even when a physical quantity to be detected is any quantity and even when any telecommunication standard other than the I2C is used, an effect of the present invention is the same.

First Embodiment

Figure 1:
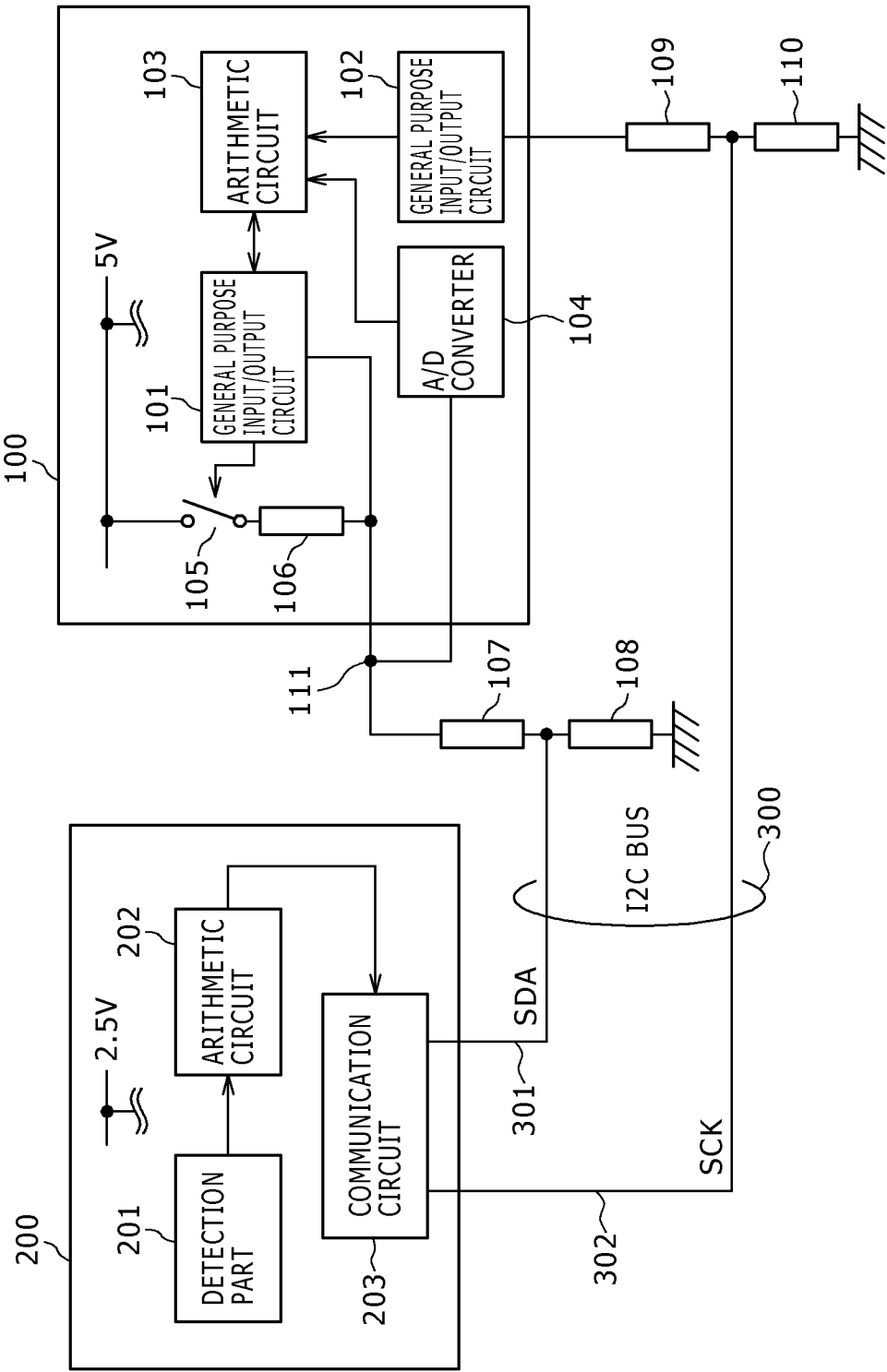
FIG. 1 is a block diagram of a physical quantity detection device 100 and a sensor 200 according to a first embodiment.

FIG. 1 is a block diagram of a physical quantity detection device 100 and a sensor 200 according to a first embodiment of the present invention. The physical quantity detection device 100 is a device that receives a detection result of the physical quantity detected by the sensor 200 through an I2C bus 300, and acquires the detection result. Although the physical quantity detection device 100 can be configured with a microcomputer that mounts thereon an arithmetic circuit 103, for example, a CPU (Central Processing Unit), the configuration is not limited to this, and another circuit can be used as long as it has the equivalent function.

The physical quantity detection device 100 is a device that operates using a power source voltage of 5 V, and has general purpose input/output circuits 101 and 102, the arithmetic circuit 103, an A/D converter 104, a switch 105, a pull-up resistor 106, data voltage dividing resistors 107 and 108, and clock voltage dividing resistors 109 and 110.

The general purpose input/output circuit 101 is a circuit for transmitting and receiving a data signal SDA301 that will be described later to/from the sensor 200, and can switch an input operation and an output operation according to an instruction from the arithmetic circuit 103. When the general purpose input/output circuit 101 switches to the input operation, the switch 105 is turned ON and the pull-up resistor 106 and a 5-V power source are connected.

The general purpose input/output circuit 102 is a circuit for transmitting and receiving a clock signal SCK302 that will be described later to/from the sensor 200, and can switch an input operation and an output operation according to an instruction from the arithmetic circuit 103.

The arithmetic circuit 103 has an arithmetic unit for performing logical operations, for example, a CPU, etc., transmits the data signal SDA301 to the sensor 200 through the general purpose input/output circuit 101, and transmits the clock signal SCK302 to the sensor 200 through the general purpose input/output circuit 102. Moreover, the arithmetic circuit 103 receives the data signal SDA301 from the sensor 200 through the general purpose input/output circuit 101 and the A/D converter 104. These operations will be explained in detail later.

The A/D converter 104 is connected in parallel with the general purpose input/output circuit 101 to the sensor 200, converts a voltage level of the data signal SDA301 transmitted by the sensor 200 into a numerical value, and outputs it to the arithmetic circuit 103. When the general purpose input/output circuit 101 transmits the data signal SDA301 to the sensor 200, the data signal SDA301 is also inputted into the A/D converter 104. These operations will be explained in detail later.

The pull-up resistor 106 is connected to a power supply of the physical quantity detection device 100 when the switch 105 is turned ON. This pulls up the data signal SDA301 transmitted by the sensor 200. Such a built-in pull-up resistor is a function that is included standardly on the microcomputer in recent years. Since the pull-up resistor 106 is a resistor manufactured using a semiconductor process, it is common that its resistance value is about several 10 kΩ.

The data voltage dividing resistors 107 and 108 are resistors for dividing a voltage level when the data signal SDA301 is transmitted to the sensor 200 from the physical quantity detection device 100. The clock voltage dividing resistors 109 and 110 are resistors for dividing a voltage level when the clock signal SCK302 is transmitted to the sensor 200 from the physical quantity detection device 100. The physical quantity detection device 100 and the sensor 200 are grounded to the same potential through the data voltage dividing resistors 107 and 108 and the clock voltage dividing resistors 109 and 110.

The sensor 200 is a device that operates using a power source voltage of, for example, 2.5V lower than a power source voltage of the physical quantity detection device 100, and is electrically connected with the physical quantity detection device 100 through the I2C bus 300. The sensor 200 has a detection part 201, an arithmetic circuit 202, and a communication circuit 203.

The detection part 201 is an element that detects a physical quantity and converts its result into an electric signal, etc. The arithmetic circuit 202 converts the detection result of the detection part 201 into digital data, for example, by pulse modulation, etc., and transmits it to the physical quantity detection device 100 as the data signal SDA301 through the communication circuit 203 and the I2C bus 300.

In the I2C communication, it is desirable for both transmission/reception sides to communicate under the same power source voltage, but when a low voltage circuit such as of a sensor is connected, it is necessary to convert a voltage level of a communication signal. This is because a digital circuit such as the arithmetic circuit 103 distinguishes the logic level of the communication signal, i.e., whether the signal is a Hi level signal or a Lo level signal, using a Hi level threshold and a Lo level threshold that are decided by its operating voltage. These thresholds are designated as a first Hi level threshold and a first Lo level threshold as a discrimination threshold that the arithmetic circuit 103 originally has.

In the case of I2C, since the clock signal SCK302 is always a signal outputted to the sensor 200 from the physical quantity detection device 100, it can be converted to a voltage level desirable to the sensor by dividing a voltage level of the clock signal SCK302 with the clock voltage dividing resistors 109 and 110. This is because the physical quantity detection device 100 is operating with a power source voltage higher than that of the sensor 200. Similarly, regarding the data signal SDA301 that is a bidirectional data signal, it can be converted into a desired voltage level for the sensor 200 by dividing the voltage level with the data voltage dividing resistors 107 and 108.

Figure 2:
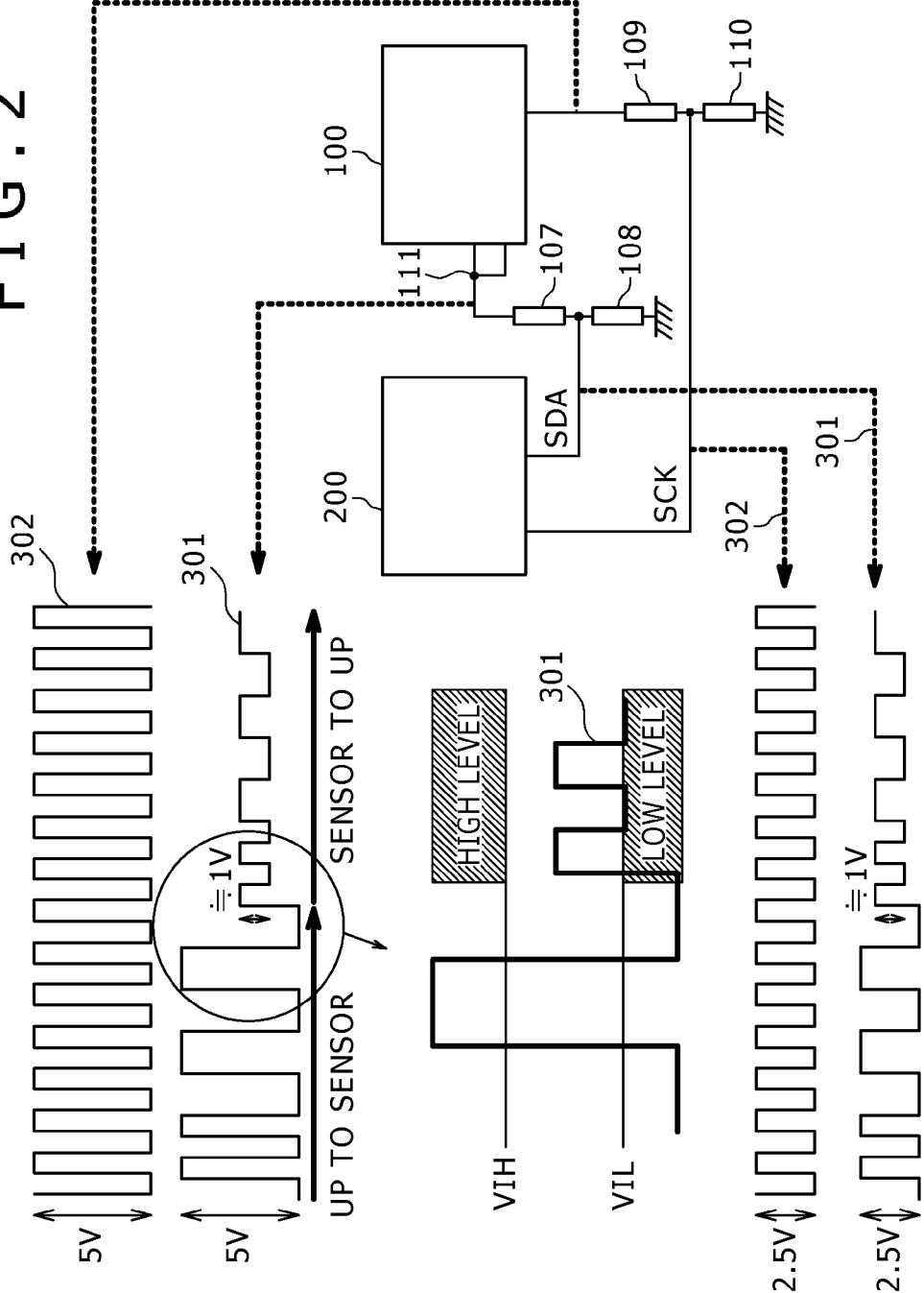
FIG. 2 is a diagram showing a voltage level of each signal that is transmitted/received between the physical quantity detection device 100 and the sensor 200.

FIG. 2 is a diagram showing a voltage level of each signal transmitted and received between the physical quantity detection device 100 and the sensor 200. Here, an operation whereby a command of measurement start is transmitted to the sensor 200 from the physical quantity detection device 100 and the sensor 200 replies a measurement result to the physical quantity detection device 100 is shown. A right-side portion of FIG. 2 is a schematic drawing of FIG. 1, an upper left-side portion of FIG. 2 is a diagram showing a signal waveform at a position nearer the physical quantity detection device 100 than the voltage dividing resistors, and a lower left-side portion of FIG. 2 is a diagram that enlarges a portion surrounding the upper left-side portion with a circle.

The clock signal SCK302 is transmitted to the sensor 200 from the physical quantity detection device 100. Although the voltage level at the time of transmission is 5V, it is reduced in voltage by the clock voltage dividing resistors 109 and 110, and when the clock signal SCK302 reaches the sensor 200, it has become 2.5V that is an operating voltage of the sensor 200. The same occurs in the case of the data signal SDA301. However, there is also a case where the data signal SDA301 is transmitted to the physical quantity detection device 100 from the sensor 200. Since the voltage level at the time of the data signal SDA301 reaching a terminal 111 has become a middle value in between a first Hi level threshold VIH and a first Lo level threshold VIL, the arithmetic circuit 103 cannot identify a logical value of the data signal SDA301 as it is. Below, details of FIG. 2 will be further explained.

Figure 3:
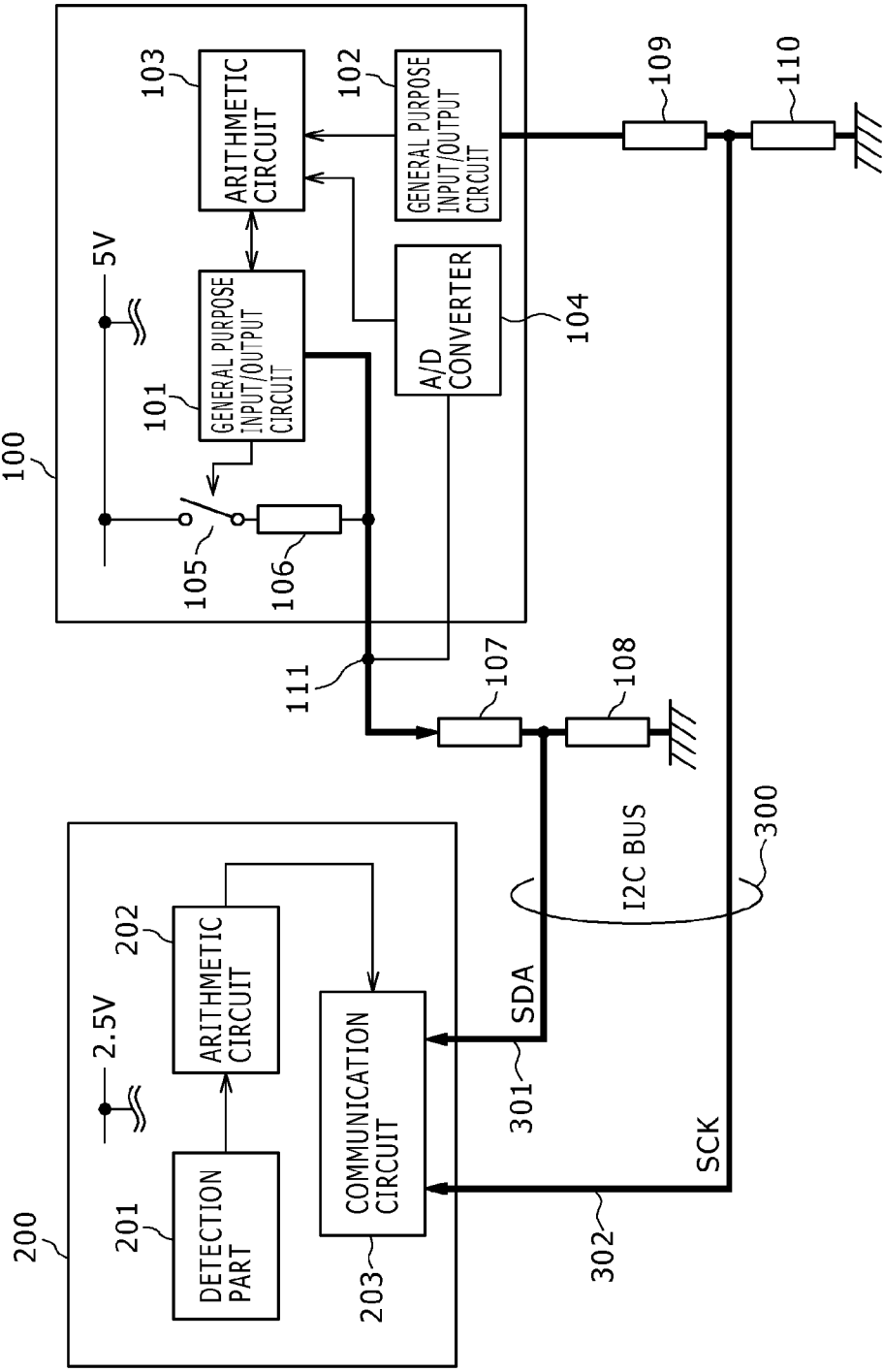
FIG. 3 is a diagram for explaining an operation in the case of transmitting a command to the sensor 200 from the physical quantity detection device 100.

FIG. 3 is a diagram for explaining an operation in the case of the physical quantity detection device 100 transmitting a command to the sensor 200. A path shown by a thick line in FIG. 3 indicates a path through which a signal is transmitted and received in this diagram.

The arithmetic circuit 103 transmits serial data to the sensor 200 by manipulating a potential of the data signal SDA301 in synchronization with a signal edge of the clock signal SCK302. Since the clock signal SCK302 is always outputted from the physical quantity detection device 100, if the general purpose input/output circuit 102 outputs the clock signal SCK302 of 5 V, the clock signal SCK302 that is subjected to voltage division will operate with an operation voltage amplitude on the sensor 200 side (in this embodiment, about 2.5 V). If the data signal SDA301 is similarly outputted with the voltage level of 5 V from the general purpose input/output circuit 101, it will have an amplitude of about 2.5 V on the sensor 200 side, and the sensor 200 will be able to receive a command without any problems.

Figure 4:
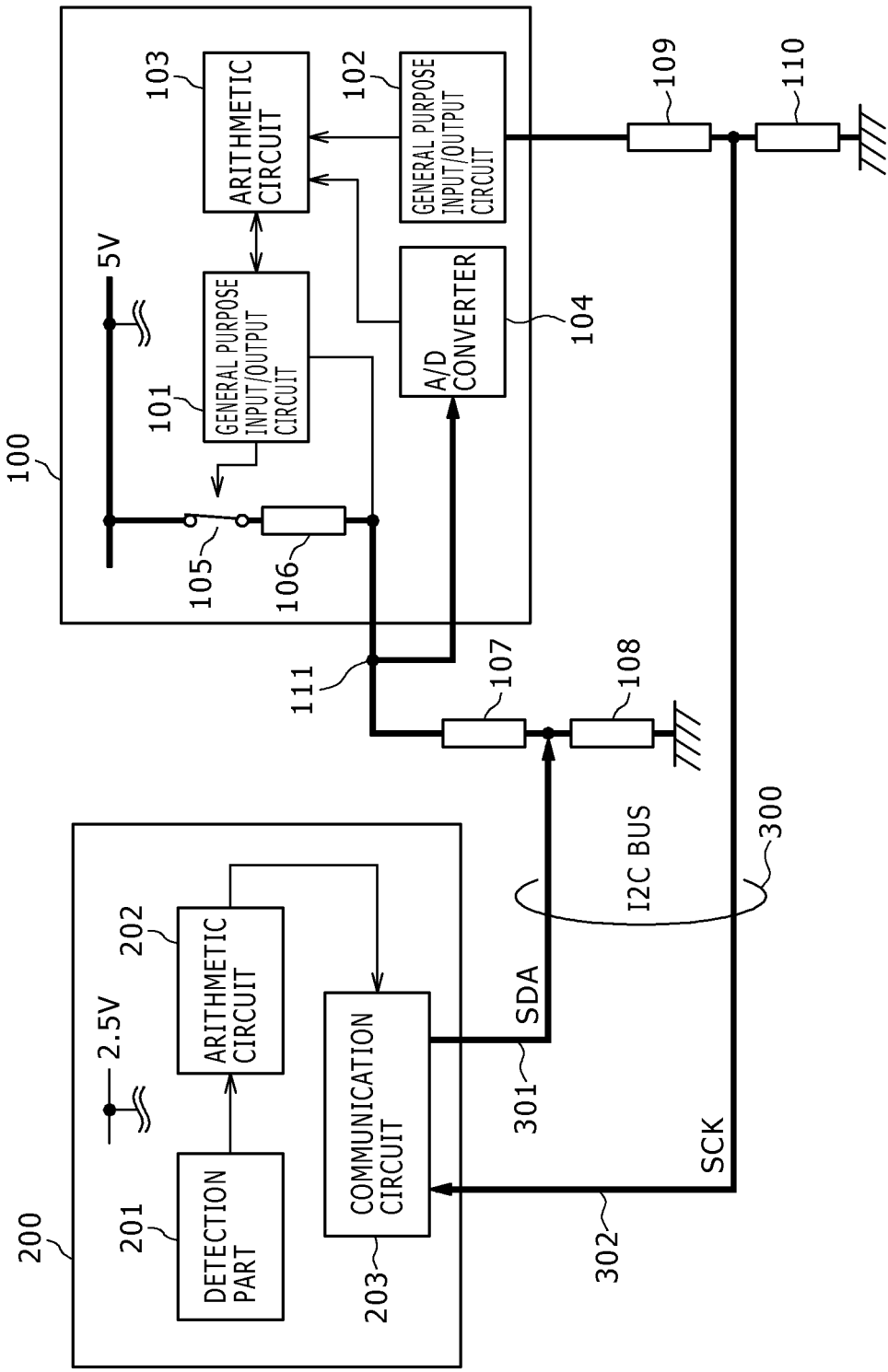
FIG. 4 is a diagram for explaining an operation in the case of transmitting a detection result to the physical quantity detection device 100 as a data signal SDA301 from the sensor 200.

FIG. 4 is a diagram for explaining an operation in the case of the sensor 200 transmitting the detection result to the physical quantity detection device 100 as the data signal SDA301. A path shown by a thick line in FIG. 4 indicates a path through which a signal is transmitted and received in this diagram.

In this diagram, an SDA terminal of the communication circuit 203 is switched to an output terminal, and the general purpose input/output circuit 101 is switched for an input operation in preparation for reception of the data signal SDA301. Moreover, since a signal must be transmitted to the physical quantity detection device 100 of a high operating voltage from the sensor 200 of a low operating voltage, the arithmetic circuit 103 connects the pull-up resistor 106 to the terminal 111 by turning on the switch 105, and pulls up the voltage level of the data signal SDA301. An output circuit of the communication circuit 203 is, for example, an open drain (collector), and since it has only a function of connecting the output terminal to a ground side, what pulls up the voltage level of the data signal SDA301 is the pull-up resistor 106. According to this configuration, it is possible to vary the voltage level of the data signal SDA301 by the communication circuit 203 handling the data signal SDA301 in an open drain drive mode.

Figure 5:
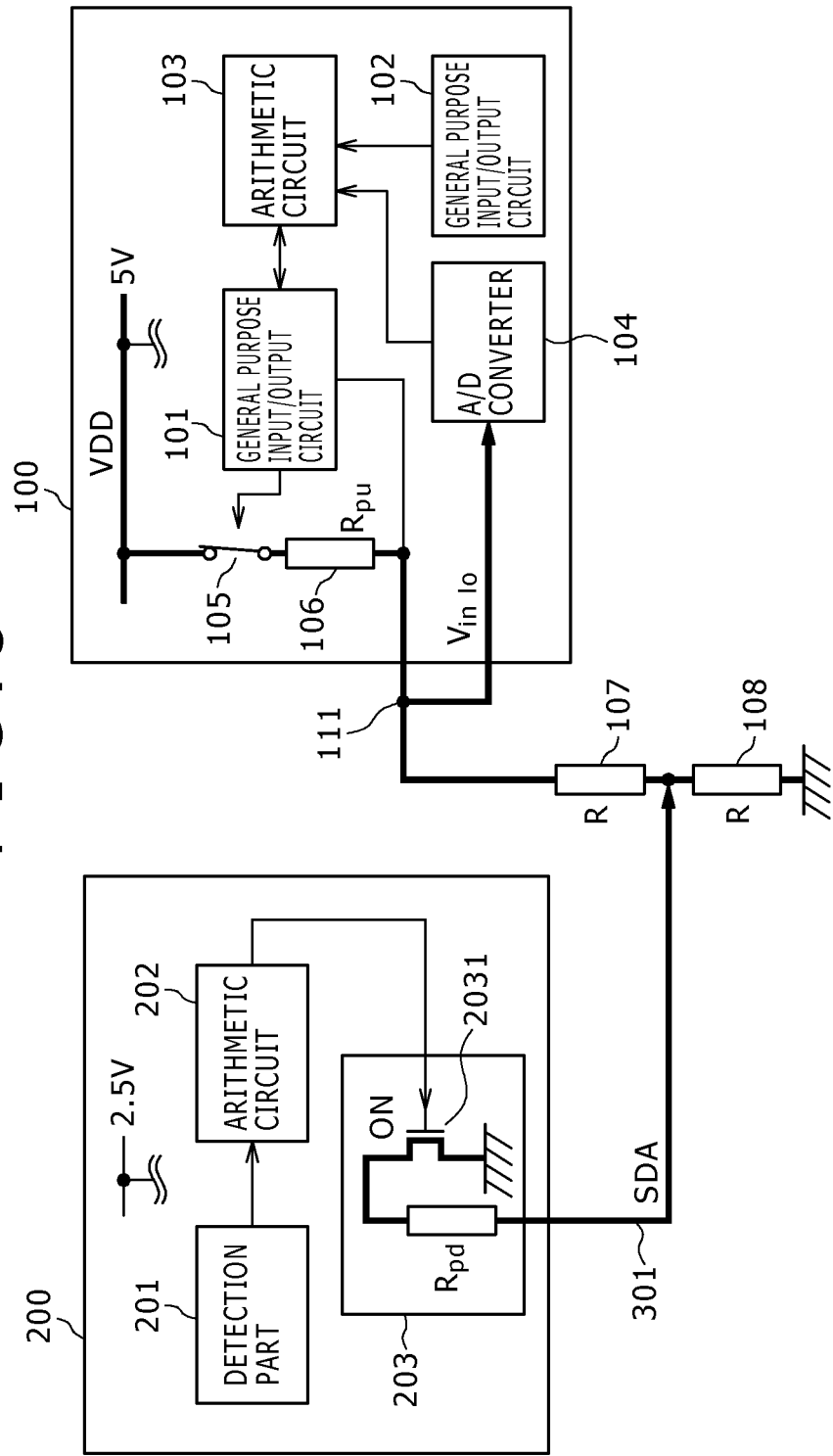
FIG. 5 is a diagram showing a circuit state when the sensor 200 outputs the data signal SDA301 of Lo level.

FIG. 5 is a diagram showing a circuit state when the sensor 200 outputs the data signal SDA301 of Lo level. In the communication circuit 203, the output terminal serves as an open drain circuit, and its transistor 2031 is connected to the ground side. Generally, since a semiconductor switch has a certain amount of circuit resistance, a circuit resistance of the transistor 2031 is denoted as Rpd. A resistance value of the data voltage dividing resistors 107 and 108 is denoted as r. On the other hand, the terminal 111 of the general purpose input/output circuit 101 is connected to an operation power source VDD through the pull-up resistor 106 (resistance value=Rpu). A potential $V_{in\_lo}$ of the terminal 111 is expressed by the following Formula 1.

$$V_{in\_lo} = \frac{R \cdot R_{pd} + R \cdot (R + R_{pd})}{R \cdot R_{pd} + (R + R_{pu}) \cdot (R + R_{pd})} \cdot VDD \quad \text{[Formula 1]}$$

In this embodiment, although respective resistance values of the data voltage dividing resistors 107 and 108 were set to the same value because the operating voltage of the physical quantity detection device 100 is twice the operating voltage of the sensor 200, the constraint is not necessarily limited to this as long as a signal amplitude of the data signal SDA301 falls within an operable range of the physical quantity detection device 100 when the data signal SDA301 is transmitted to the sensor 200 from the physical quantity detection device 100.

In the above-mentioned Formula 1, it is understood that setting the pull-up resistor 106=40 kΩ and r=10 kΩ, a voltage of the input terminal 111 drops only to about 1 V even when the sensor 200 outputs the data signal SDA301 of Lo level. Since a Lo level threshold VIH of the arithmetic circuit 103 whose operating voltage is 5 V is in a vicinity of about 1.7 V, it is a voltage level that can determine that the signal is the Lo level signal, but it cannot be said that there is a sufficient margin in it.

Figure 6:
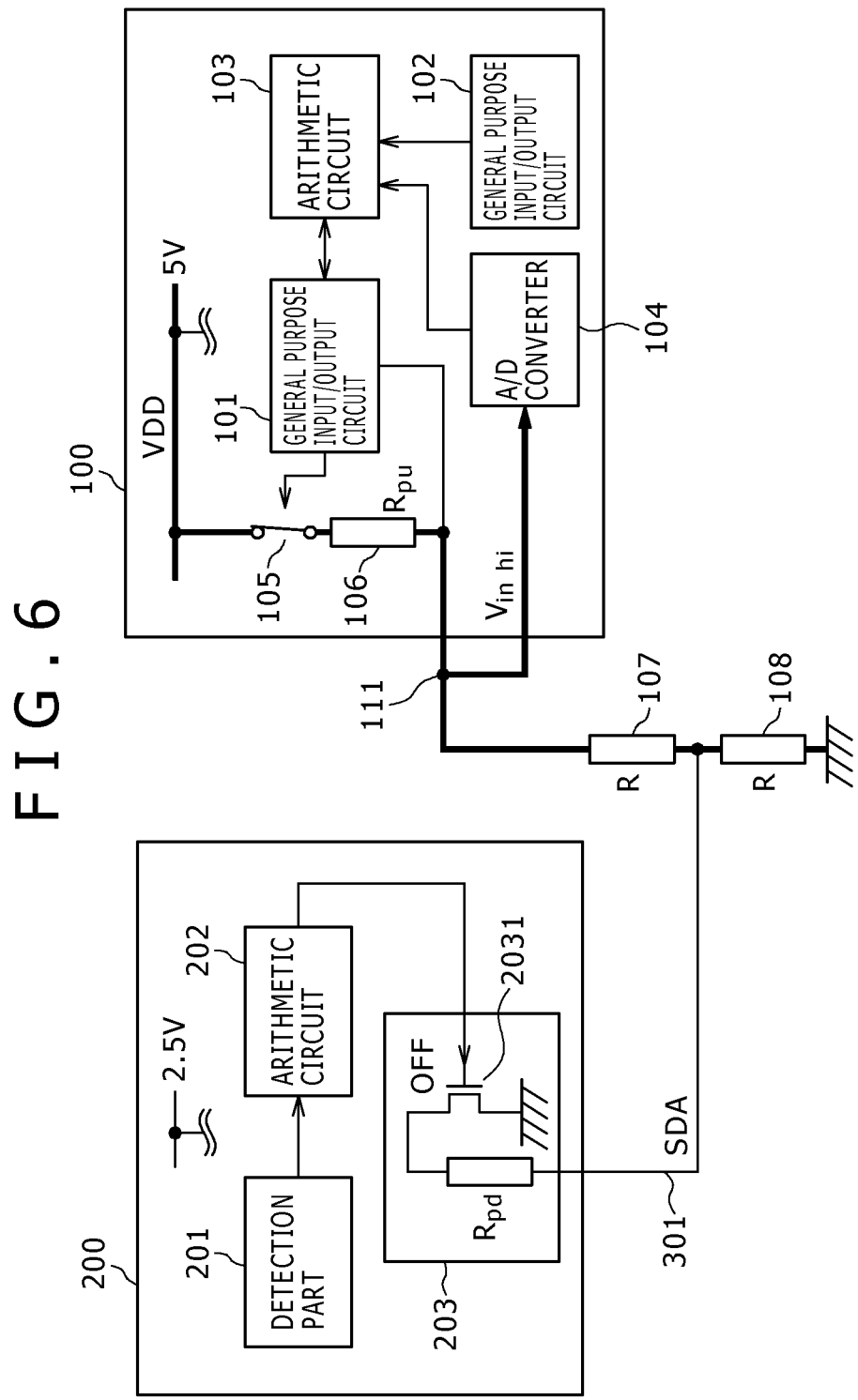
FIG. 6 is a diagram showing a circuit state when the sensor 200 outputs the data signal SDA301 of Hi level.

FIG. 6 is a diagram showing a circuit state in the case of the sensor 200 outputting the data signal SDA301 of Hi level. The communication circuit 203 has the output terminal that is open, and the potential of the data signal SDA301 does not depend on the sensor 200 side. A potential $V_{in\_hi}$ of the terminal 111 at this time becomes a potential that is divided by the pull-up resistor 106 and the data voltage dividing resistors 107 and 108, and is expressed by the following Formula 2.

$$V_{in\_bi} = \frac{2R}{2R + R_{pu}} \cdot VDD \quad \text{[Formula 2]}$$

In the above-mentioned Formula 2, if the same constant as Formula 1 is used, even when the sensor outputs the data signal SDA301 of Hi level, the voltage of the input terminal 111 becomes only about 1.75 V and does not reach 3.5 V that is the Hi level threshold VIH of the arithmetic circuit 103. This means that the arithmetic circuit 103 cannot recognize the Hi level signal, and the voltage of the input terminal 111 is neither a Hi level nor a Lo level and is a potential that must not be used in the digital circuit.

In Formula 1 and Formula 2, no matter what values the data voltage dividing resistors 107 and 108 whose parameters are changeable are set to realistically, there is no constant that satisfies the Hi level threshold VIH and the Lo level threshold VIL of the arithmetic circuit 103. That is, only with the circuit configuration shown in FIG. 1, the data signal SDA301 cannot be used for bidirectional communication.

Therefore, in this first embodiment, it is decided that when transmitting a signal to the sensor 200 from the physical quantity detection device 100, the first Hi level threshold VIH and the first Lo level threshold VIL are used, and when transmitting a signal to the physical quantity detection device 100 from the sensor 200, a second Hi level threshold and a second Lo level threshold that are decided on software are used. This is aimed to make the physical quantity detection device 100 capable of the bidirectional communication even when the voltage level of the signal transmitted to the physical quantity detection device 100 from the sensor 200 does not reach each threshold.

In order to realize the above, in this first embodiment, the terminal 111 of the general purpose input/output circuit 101 and the A/D converter 104 are connected in parallel to the sensor 200, so that the signal transmitted and received between the physical quantity detection device 100 and the sensor 200 is configured to be inputted also into the A/D converter 104. When a signal is transmitted to the sensor 200 from the physical quantity detection device 100, the A/D converter 104 is just being connected. When the sensor 200 transmits a signal to the physical quantity detection device 100, the signal is converted into a numerical value by the A/D converter 104 performing A/D conversion on the potential of the data signal SDA301 in synchronization with a timing at which the arithmetic circuit 103 manipulates the clock signal SCK302, and is outputted to the arithmetic circuit 103.

Figure 7:
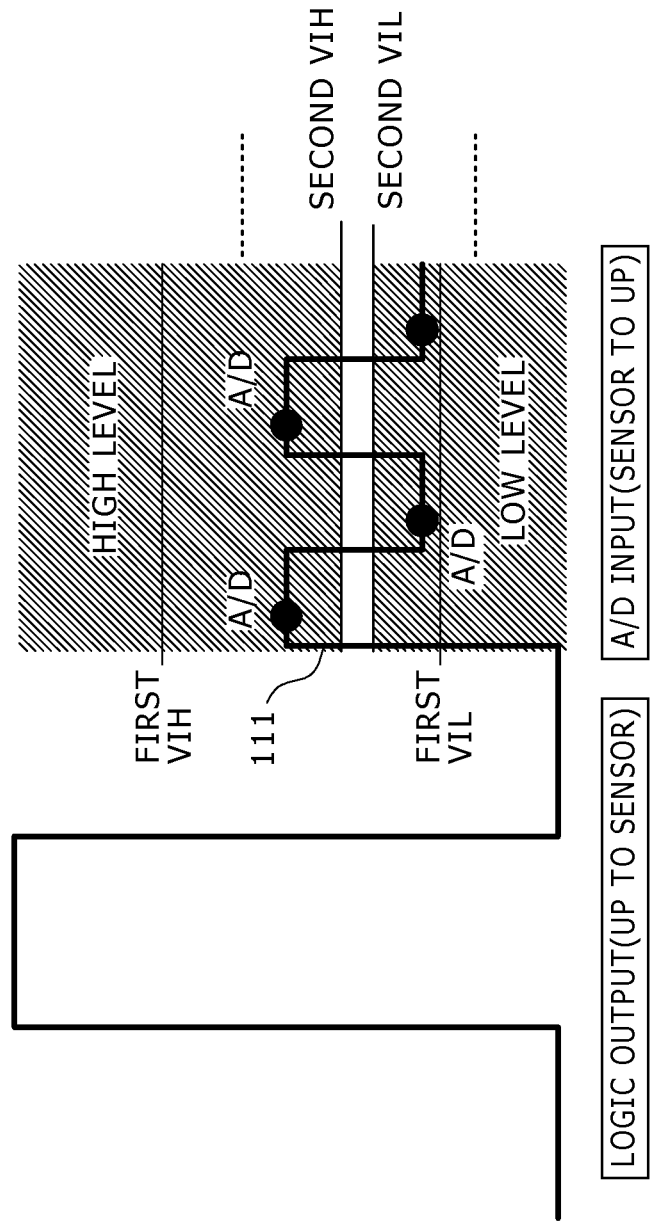
FIG. 7 is a diagram showing a situation where Hi/Lo levels of the signal is determined using a second Hi level threshold VIH and a second Lo level threshold VIL that were set up on arithmetic processing.

FIG. 7 is a diagram showing a situation where the arithmetic circuit 103 determines Hi/Lo levels of a signal using a second Hi level threshold VIH and a second Lo level threshold VIL that were set up on arithmetic processing. The arithmetic circuit 103 determines that when a value obtained by the A/D converter 104 converting the signal into a numerical value is larger than the second Hi level threshold VIH, the signal is a Hi level signal, and when it is smaller than the second Lo level threshold VIL, the signal is a Lo level signal.

In the case where the second Hi level threshold VIH and the second Lo level threshold VIL as shown in FIG. 7 are performed by the software, it takes a certain amount of time for determination processing of comparing the data signal SDA301 received from the sensor 200 and each threshold. However, since the data signal SDA301 transmitted from the sensor 200 changes in synchronization with the clock signal SCK302 that the arithmetic circuit 103 outputs, if the timing of the clock signal SCK302 is manipulated to the determination processing of the software, the logical value of the data signal SDA301 to the clock signal SCK302 will not depend on the timing of the clock signal SCK302. That is, the physical quantity detection device 100 can receive a correct data signal SDA301 from the sensor 200. In addition, since the threshold on the software can be set up arbitrarily, it can be flexibly adapted to an arbitrary combination of a difference of the operating voltages of the sensor 200 and the physical quantity detection device 100, a resistance value of the pull-up resistor 106, other parameters, etc.

First Embodiment: Summary

As described above, when receiving the data signal SDA301 from the sensor 200, the physical quantity detection device 100 according to this first embodiment determines the Hi/Lo levels of the data signal SDA301 using the second Hi level threshold and the second Lo level threshold that are set up on software processing in place of the first Hi level threshold and the first Lo level threshold. This enables the physical quantity detection device 100 to make the bidirectional communication with the sensor 200 whose power source voltage is different only using functions and resistors that the general purpose microcomputer normally has. Therefore, a bidirectional level converter using a semiconductor as is described in Patent Literature 1 becomes unnecessary, and it is possible to configure a communication circuit cheaply. Moreover, since communication can be realized only with the resistor and the software, the reliability of the circuit can be improved, and the influence due to variations of the resistor and a circuit characteristic can also be reduced. Eventually, it is possible to configure the whole device cheaply and to obtain high reliability.

Second Embodiment

In the first embodiment, it was explained that the arithmetic circuit 103 determined the Hi/Lo levels of the data signal SDA301 using Hi/Lo level thresholds set up on the software. In the second embodiment of the present invention, an operation example where the threshold for determining the Hi/Lo levels is varied according to a voltage level variation of the data signal SDA301 will be explained. Since configurations of devices are the same as those of the first embodiment, an explanation will be given below focusing on a difference point.

Figure 8:
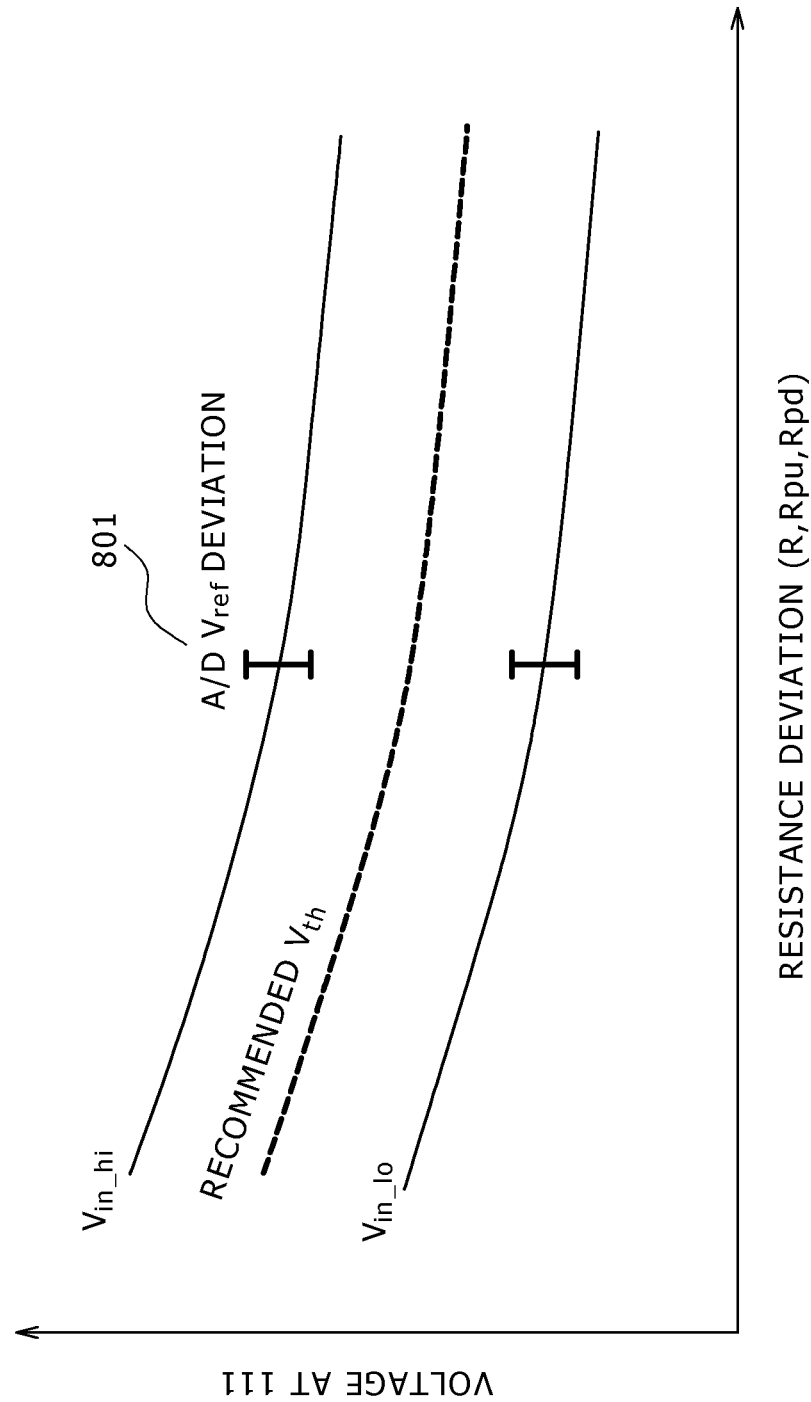
FIG. 8 is a diagram showing a relationship between $V_{in\_hi}$ and $V_{in\_lo}$ that varied by an individual difference of a part, a temperature change, deterioration with time, etc.

FIG. 8 is a diagram showing a relationship of the $V_{in\_hi}$ and the $V_{in\_lo}$ in the case where the pull-up resistor 106, each voltage dividing resistor, a reference voltage of the A/D converter 104, etc. vary due to an individual difference of a part, a temperature change, deterioration with time, etc. The vertical axis schematically denotes a potential of the terminal 111 (voltage to be A/D converted) and the horizontal axis schematically denotes an amount of change of each parameter due to the temperature change and the individual difference. A characteristic 1101 shows a reference voltage variation of the A/D converter 104, and this value also takes part in as an error factor when logical determination by the software is executed.

As shown in FIG. 8, an optimal threshold differs with a change of a circuit constant, and further varies due to external factors such as temperature even when the physical quantity detection device 100 and the sensor 200 are working. Since a difference between the voltage $V_{in\_hi}$ and the voltage $V_{in\_lo}$ explained in the first embodiment is small, there is a probability that when the logical determination by the software with a single threshold is performed, it may lead to misdetermination. Then, as shown in FIG. 8, it is thought desirable to change also a recommended software threshold $V_{th}$ together with variations of the $V_{in\_hi}$ and the $V_{in\_lo}$. Although it can also be thought to change both the second Hi level threshold VIH and the second Lo level threshold VIL. in this first embodiment, the Hi/Lo levels shall be determined with the single threshold $V_{th}$.

FIG. 9 illustrates a procedure of calculating the threshold $V_{th}$. In order to adjust the threshold $V_{th}$ in combination with variations of the voltage $V_{in\_hi}$ and the voltage $V_{in\_lo}$, what is necessary is just to calculate averages of the $V_{in\_hi}$ and the $V_{in\_lo}$ routinely and set the threshold $V_{th}$ to a value between them. Then, the arithmetic circuit 103 records respective A/D conversion results of the data signal SDA301 of Hi level and the data signal SDA301 of Lo level individually. What is necessary about a recording destination is just to record it in a storage device, for example, memory that the arithmetic circuit 103 has or the like.

The arithmetic circuit 103 adds these recording values, respectively, as shown in the following Formula 3 and Formula 4, and subsequently performs smoothing processing on them independently, respectively (for example, a moving average, an arithmetic mean, a weighted mean, a mean square, etc.). The arithmetic circuit 103 calculates the threshold $V_{th}$ as a median value of the $V_{in\_hi}$ and the $V_{in\_lo}$ by the following Formula 5.

$$\sum_{i=0}^{n} Hs = Hi0 + Hi1 \ldots Hin \quad \text{[Formula 3]}$$

$$\sum_{i=0}^{n} Ls = Lo0 + Lo1 \ldots Lon \quad \text{[Formula 4]}$$

$$V_{th} = (Hs + Ls)/2 \quad \text{[Formula 5]}$$

Although in the above-mentioned explanation, processing whereby the $V_{in\_hi}$ and the $V_{in\_lo}$ were accumulated in a buffer and were subjected to average processing was explained, the processing may be single buffering of recording only a preceding value. Moreover, it is possible to learn a difference of the $V_{in\_hi}$ and the $V_{in\_lo}$ and designate the median value of them as the threshold $V_{th}$, or to perform the learning only at the time of starting.

Second Embodiment: Summary

As described above, the physical quantity detection device 100 according to this second embodiment calculates the threshold $V_{th}$ for determining the Hi/Lo levels of the data signal SDA301 by accumulating and averaging the data signals SDA301 of respective Hi/Lo levels in the past. Thereby, even when the $V_{in\_hi}$ and the $V_{in\_lo}$ vary by factors such as a temperature change, the Hi/Lo levels can be determined always with an optimal threshold.

Third Embodiment

In the second embodiment, it was explained that the Hi/Lo levels were determined using the single threshold $V_{th}$. In a third embodiment of the present invention, an operation example where dead zones are provided in the upper and lower sides of the threshold $V_{th}$, and when the A/D conversion result of the data signal SDA301 falls in the dead zones, it is determined that the signal is a communication error will be explained. Since configurations of devices are the same as those of the first and second embodiments, an explanation will be given below focusing on a difference point.

Figure 10:
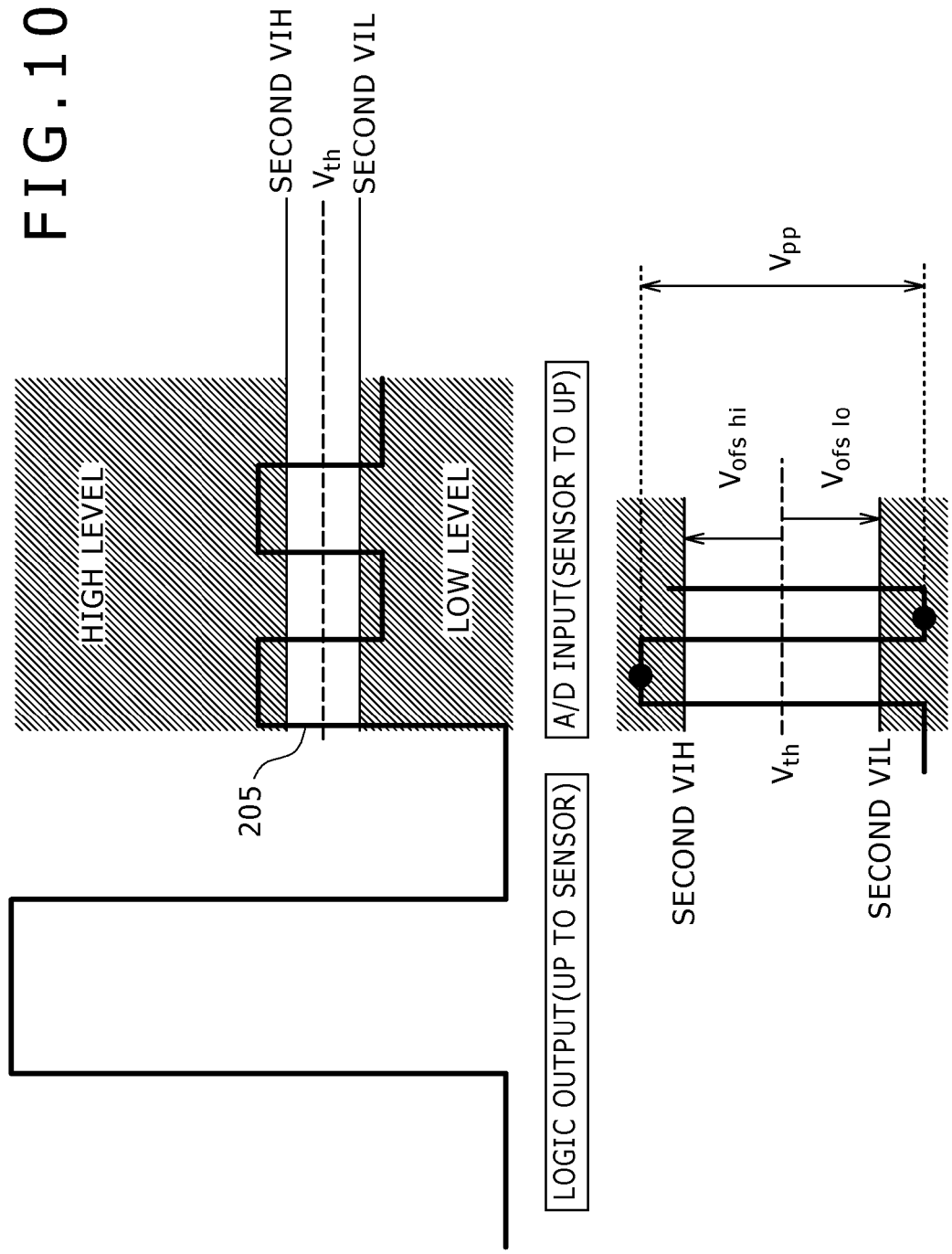
FIG. 10 is a diagram for explaining a procedure of calculating a dead zone in a third embodiment.

FIG. 10 is a diagram for explaining a procedure of calculating the dead zones in this third embodiment. The dead zones can be calculated by shifting the threshold $V_{th}$ explained in the second embodiment to give vertical offsets. Specifically, as shown in the following Formula 6, an offset width $V_{ofs\_hi/lo}$ of the threshold $V_{th}$ may be calculated according to a value of the threshold $V_{th}$, or as shown in the following Formula 7, the offset width $V_{ofs\_hi/lo}$ may be calculated according to a difference $V_{pp}$ of the $V_{in\_hi}$ and the $V_{in\_lo}$. The function f is a function configured so that when the threshold $V_{th}$ or the difference $V_{pp}$ becomes small, the offset width $V_{ofs\_hi/lo}$ may become small, and when the threshold $V_{th}$ or the difference $V_{pp}$ becomes large, the offset width $V_{ofs\_hi/lo}$ may become large.

$$V_{ofs\_hi/lo} = f(V_{th}) \quad \text{[Formula 6]}$$

$$V_{ofs\_hi/lo} = f(V_{pp}) \quad \text{[Formula 7]}$$

When the result of having performed the A/D conversion on the data signal SDA301 falls in the dead zones, the arithmetic circuit 103 processes the signal as the communication error.

Third Embodiment: Summary

As described above, according to the physical quantity detection device 100 according to this third embodiment, by providing the dead zones, it becomes possible to perform further flexible logic determination and it is possible to secure redundancy against disturbance such as an electric noise. Moreover, evaluating a value of the $V_{pp}$ makes it possible to perform a diagnosis as to whether the signal has a sufficient amplitude etc., which can improve failure detection performance as the whole sensor. Even when the sizes and a calculation method of these dead zones change, the effect of the present invention remains the same.

Fourth Embodiment

In a fourth embodiment of the present invention, an operation example where a timing at which the arithmetic circuit 103 samples the data signal SDA301 is adjusted will be explained. Since configurations of devices are the same as those of the first to third embodiments, an explanation will be given below focusing on a difference point.

Figure 11:
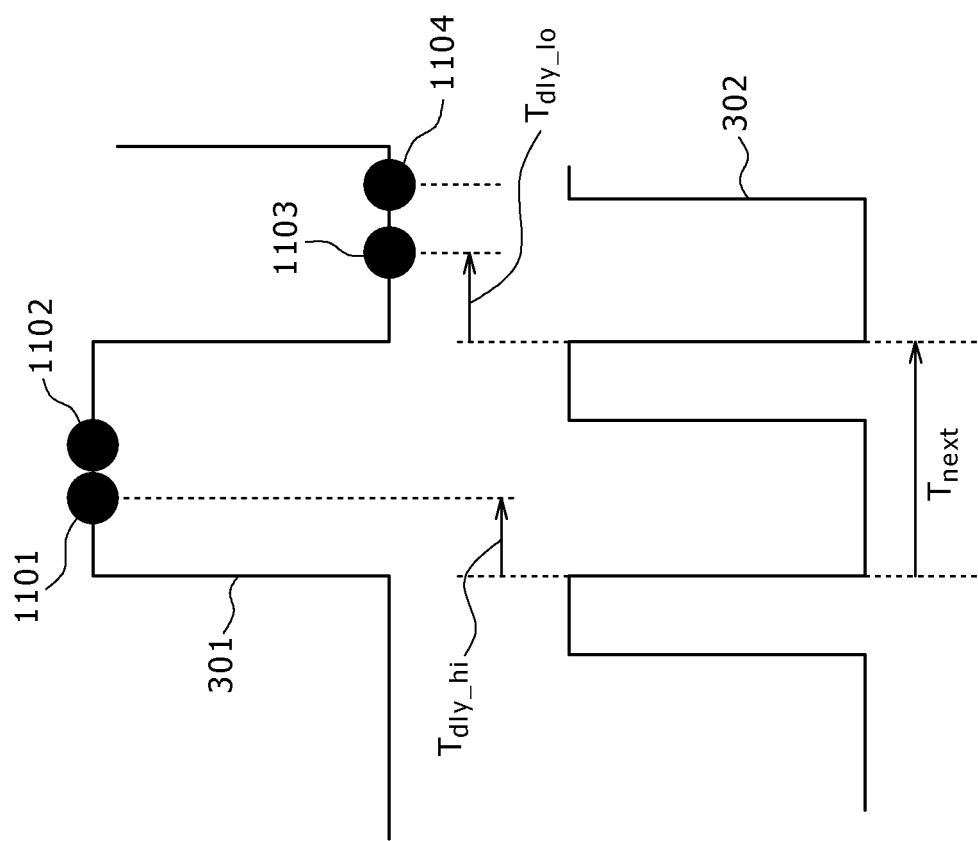
FIG. 11 is a diagram for explaining a timing at which an arithmetic circuit 103 samples the data signal SDA301 in a fourth embodiment.

FIG. 11 is a diagram for explaining a timing at which the arithmetic circuit 103 samples the data signal SDA301 in this fourth embodiment. Solid circles 1101 and 1102 represent timings at which the data signal SDA301 of Hi level is sampled. Solid circles 1103 and 1104 represent timings at which the data signal SDA301 of Lo level is sampled. A delay $T_{dly\_hi}$ is a delay time from a fall timing of the clock signal SCK302 to a timing at which the arithmetic circuit 103 samples the data signal SDA301 of Hi level. A delay $T_{dly\_lo}$ is a delay time from the fall timing of the clock signal SCK302 to a timing at which the arithmetic circuit 103 samples the data signal SDA301 of Lo level.

Although in the first to third embodiments, it was assumed that the arithmetic circuit 103 sampled the data signal SDA301 at the fall timing of the clock signal SCK302, there is a case where when a rise timing of the data signal SDA301 has become blunt by an influence of a parasitic capacitance of the circuit, etc., it is desirable that the sampling may be performed slightly being delayed from the fall timing of the clock signal SCK302. Therefore, in this fourth embodiment, it is decided that the above-mentioned delay $T_{dly\_hi}$ and delay $T_{dly\_lo}$ are provided.

A reason why two kinds of delay times are provided is that effects that the resistance value and the parasitic capacitance have on a waveform of the data signal SDA301 differ between in the Hi level signal and in the Lo level signal. Therefore, it is decided that two kinds of delay times are provided so that the timing at which the Hi level signal is sampled and the timing at which the Lo level data signal is sampled may become mutually different.

When the waveform of the data signal SDA301 has actually become blunt, whether the sampling is performed at the time when the waveform becomes flat cannot be understood unless a value immediately after the sampling is sampled separately. Then, the arithmetic circuit 103 performs the sampling twice or more. (a) when all the results of the sampling show the Hi level, it is determined that the signal is the Hi level signal, (b) when all the results of the sampling show the Lo level, it is determined that the signal is the Lo level signal, and (c) when the results of respective times of the sampling do not coincide, the signal is processed as the communication error.

When there is a voltage difference more than or equal to a predetermined voltage value between sampling results (for example, the solid circles 1101 and 1102) of respective times, there is a possibility that the data signal SDA301 rises and falls in a blunt manner. In this case, expecting that the waveform is blunt, certainty of the sampling may be made to improve by expanding a sampling interval of respective times (for example, an interval between the solid circles 1101 and 1102) on and after next time. Even when the sampling frequency on and after next time is lowered, the same effect can be exerted. After changing a sampling timing and a sampling period temporarily and comparing the sampling results of respective times, if these results are in agreement, the sampling timing and the sampling period that were changed may be restored to original settings.

Fourth Embodiment: Summary

As described above, the physical quantity detection device 100 according to this fourth embodiment performs multiple-times of the sampling on the data signal SDA301 of the same value, compares the sampling results of respective times, and adjusts the sampling timing. Thereby, even when the waveform of the data signal SDA301 has become blunt, the value of the data signal SDA301 can be certainly acquired by setting up the sampling timing appropriately.

Fifth Embodiment

In the foregoing, although the invention made by the present inventors was concretely explained based on the embodiments, it cannot be overemphasized that the present invention is not limited to the above-mentioned embodiments, and can be altered variously within a range that does not deviate from its gist.

For example, although in the first to fourth embodiments, it was explained that the physical quantity detection device 100 and the sensor 200 communicated with each other using an I2C communication system, in the case where the operating voltages of these devices differ and the signal voltage levels are different, the same effect can be exerted by adopting the same configuration as that of the present invention. Moreover, although it was explained that the voltage level of the communication signal was lowered using the voltage dividing resistors, the same function can be exerted also by using a circuit capable of lowering the voltage level, etc.

Moreover, the whole or a part of the above-mentioned configurations, functions, processing parts, etc. may also be realized as hardware, for example, by designing it with an integrated circuit, and may also be realized as software by a processor executing a program for realizing each function. Information of a program, a table, etc. each realizing each function can be stored in a storage device such as memory and a hard disk drive, and a storage medium such as an IC card and a DVD.

LIST OF REFERENCE SIGNS

100: physical quantity detection device,
101, 102: General purpose input/output circuit,
103: Arithmetic circuit,
104: A/D converter,
105: Switch,
106: Pull-up resistor,
107, 108: Data voltage dividing resistors,
109, 110: Clock voltage dividing resistors,
200: Sensor,
201: Detection part,
202: Arithmetic circuit,
203: Communication circuit,
300: I2C bus,
301: Data signal SDA, and
302: Clock signal SCK.

The invention claimed is:

1. A physical quantity detection device that comprises:
   a communication line through which communication is performed bidirectionally with a sensor for detecting a physical quantity;
   a logical circuit that operates at an operating voltage higher than an operating voltage of the sensor and acquires a value of the physical quantity detected by the sensor via the communication line;
   an input/output circuit for transmitting/receiving a signal to/from the sensor;
   an A/D converter for converting the signal received by the input/output circuit into a numerical value; and
   a voltage reducing circuit for performing voltage reduction on a voltage of the signal that the logical circuit outputs to the sensor through the communication line,
   wherein the logical circuit includes an arithmetic unit that determines whether the signal that the A/D converter converted into the numerical value is a Hi level signal or a Lo level signal according to predetermined first Hi level signal and first Lo level signal,
   wherein the input/output circuit and the A/D converter are connected to the sensor in a mutual parallel manner, and
   wherein the arithmetic unit acquires a value of the physical quantity transmitted by the sensor by determining whether the signal that the A/D converter converted into is a Hi level signal or a Lo level signal according to a second Hi level threshold and a second Lo level threshold decided on arithmetic processing performed by the arithmetic unit in place of the first Hi level threshold and the first Lo level threshold when receiving a signal describing the physical quantity from the sensor through the communication line.

2. The physical quantity detection device according to claim 1,
   wherein the arithmetic unit sets the second Hi level threshold and the second Lo level threshold to different values.

3. The physical quantity detection device according to claim 1,
   wherein the arithmetic unit records the Hi level signal and the Lo level signal that are received from the sensor, respectively, and uses a value between the recorded Hi level signal and Lo level signal as the second Hi level threshold, the second Lo level threshold, or a threshold that serves both as the second Hi level threshold and the second Lo level threshold.

4. The physical quantity detection device according to claim 3,
   wherein the arithmetic unit uses a moving average, an arithmetic mean, a weighted mean, or a mean square of the recorded Hi level signal and Lo level signal as the threshold that serves both as the second Hi level threshold and the second Lo level threshold.

5. The physical quantity detection device according to claim 3,
   wherein the arithmetic unit calculates a median value of the recorded Hi level signal and Lo level signal, designates a value obtained by adding an offset to the median value as the second Hi level threshold, and designates a value obtained by subtracting an offset from the median value as the second Lo level threshold.

6. The physical quantity detection device according to claim 5,
   wherein the arithmetic unit enlarges the offset much with a larger absolute value of a difference between the recorded Hi level signal and Lo level signal.

7. The physical quantity detection device according to claim 5,
  wherein when a result obtained by the A/D converter converting the signal into a numerical value is between the second Hi level threshold and the second Lo level threshold, the arithmetic unit assumes that it failed to receive the signal from the sensor.

8. The physical quantity detection device according to claim 1,
  wherein when receiving the signal from the sensor, the arithmetic unit performs sampling of the same value by a plurality of times at mutually different timings.

9. The physical quantity detection device according to claim 8,
  wherein the arithmetic unit sets the timing at the time of sampling the Hi level signal transmitted by the sensor and the timing at the time of sampling the Lo level signal transmitted by the sensor to mutually different timings.

10. The physical quantity detection device according to claim 8,
  wherein when a difference between the signals each acquired at each time of the sampling is more than or equal to a predetermined value, the arithmetic unit temporarily delays the timing or temporarily lowers a frequency of the sampling, and then retries the sampling.

11. The physical quantity detection device according to claim 8,
  wherein when results of a plurality of times of sampling differ from one another, the arithmetic unit assumes that it failed to receive the signal from the sensor.

12. The physical quantity detection device according to claim 1,
  wherein the logical circuit has a pull-up resistor connected between an input terminal of the A/D converter and an operation power source of the logical circuit, and
  wherein the voltage reducing circuit has one end connected to the pull-up resistor and has another end connected to the ground.

13. The physical quantity detection device according to claim 1,
  wherein the voltage reducing circuit is configured as voltage dividing resistors arranged between the sensor and the logical circuit.

14. The physical quantity detection device according to claim 1,
  wherein the logical circuit communicates with the sensor using an I2C system.

\* \* \* \* \*